(12) United States Patent
Kim

(10) Patent No.: US 6,800,542 B2
(45) Date of Patent: Oct. 5, 2004

(54) METHOD FOR FABRICATING RUTHENIUM THIN LAYER

(75) Inventor: Younsoo Kim, Kyoungki-do (KR)

(73) Assignee: Hynix Semiconductor Inc., Kyoungki-di (KR)

( * ) Notice: Subject to any disclaimer, the term of this patent is extended or adjusted under 35 U.S.C. 154(b) by 374 days.

(21) Appl. No.: 10/136,254

(22) Filed: May 1, 2002

(65) Prior Publication Data

US 2002/0173054 A1 Nov. 21, 2002

(30) Foreign Application Priority Data

May 3, 2001 (KR) ........................................ 2001-23995

(51) Int. Cl.[7] .......................................... H01L 21/3205
(52) U.S. Cl. ........................ 438/585; 438/650; 438/686
(58) Field of Search ................................. 438/584, 585, 438/650, 686

(56) References Cited

U.S. PATENT DOCUMENTS

| | | |
|---|---|---|
| 3,732,694 A | 5/1973 | Blumenthal et al. |
| 3,846,339 A | 11/1974 | Blumenthal et al. |
| 3,970,588 A | 7/1976 | Taylor et al. |
| 4,124,538 A | 11/1978 | Armstrong et al. |
| 5,344,546 A | 9/1994 | Kiesele et al. |
| 5,886,204 A | 3/1999 | Warren et al. |
| 6,133,159 A | 10/2000 | Vaartstra et al. |
| 6,144,060 A | 11/2000 | Park et al. |
| 6,613,656 B2 * | 9/2003 | Li ............................. 438/584 |

OTHER PUBLICATIONS

Communication from Korean Intellectual Property Office dated Feb. 25, 2003 (3 pages).

* cited by examiner

*Primary Examiner*—George Fourson
*Assistant Examiner*—Thanh Pham
(74) *Attorney, Agent, or Firm*—Marshall, Gerstein & Borun LLP

(57) ABSTRACT

A method for fabricating a Ru thin layer by using an atomic layer deposition (ALD) technique is disclosed. The method comprises the steps of loading a substrate into a reaction chamber for an atomic layer deposition, adsorbing $RuX_n$ (wherein n is 2 or 3), which is a Ru precursor, onto the substrate and injecting a reductive reaction gas into the reaction chamber.

9 Claims, 2 Drawing Sheets

METHOD FOR FABRICATING RUTHENIUM THIN LAYER

TECHNICAL FIELD

The present invention relates to a method for fabricating a thin layer, and, more particularly, to a method for fabricating a ruthenium (Ru) thin layer by using an atomic layer deposition (ALD) technique.

DESCRIPTION OF THE RELATED ART

A chemical vapor deposition (CVD) technique has been used to deposit a layer on a substrate such as a silicon wafer. A precursor used in the CVD technique is a thermally decomposed volatile compound to be adsorbed into a heated substrate at a temperature that exceeds the decomposition temperature. Layers, such as a metal, a metal mixture, a metal alloy, a ceramic, a metal compound and a mixture thereof, are deposited by the CVD technique, dependent on selection of and reaction conditions of a precursor.

A ruthenium (Ru) layer formed by the CVD technique in an integrated circuit process of a semiconductor device has an excellent conductivity, a high stability in a wide temperature range and a good adhesion with a silicon layer, a silicon oxide layer and a ceramic oxide layer.

The Ru layer formed by the CVD technique is employed as an electrode of a capacitor or a wire material in giga DRAMs and FRAMs. Because the Ru layer scarcely reacts on a silicon or metal oxide, the Ru layer may be used as a barrier layer against silicon or oxygen. Also, the Ru is used as a catalyst in polymer synthesis processes.

Recently, a Ru precursor has been used in a CVD technique.

A conventional method for fabricating a Ru layer will now be described. Ru precursor compounds of a conventional Ru layer used in the CVD technique are $RuX_2$ or $RuX_3$ (where, X represents an anionic ligand), of which oxidation states are of +2 and +3 respectively, and oxygen ($O_2$) or hydrogen ($H_2$) gas is used as a reaction gas.

At this time, the oxygen reduces the Ru by a reaction with the Ru precursor compound and reacts with the anionic ligand "X" to generate by-products. The ligand is any one of atoms, molecule or ions ($NH_3$, $H_2O$, $Cl^-$, $CN^-$ or the like), which have non-covalent electron pairs. "X" of $RuX_2$ and $RuX_3$ is β-diketonate, cyclopentadienyl or alkylcyclopentadienyl. The Ru precursor compounds ($RuX_2$, $RuX_3$) and by-products is produced by the following reactions:

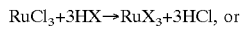
$RuCl_3 + 3HX \rightarrow RuX_3 + 3HCl$, or $RuCl3 + 2HX \rightarrow RuX2 + 2HCl$ (add a reducing agent such as Zn or the like)

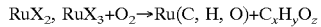
$RuX_2, RuX_3 + O_2 \rightarrow Ru(C, H, O) + C_xH_yO_z$

The last equation represents a CVD reaction of the Ru precursor compounds. In these oxidation and reduction reactions, neutral products, such as an alkene of CO, $H_2$, butene or the like, and anionic and cationic products, such as alkyl and β-diketonate of H, butyl or the like, are produced.

The neutral products may be removed by using a vacuum pump but the anionic and cationic products may be remained in the Ru thin layer as impurities. The reaction of oxygen and the ligand is not only complex, but also rapidly performed so that impurities such as carbon, hydrogen and oxygen remain in the Ru thin layer. The remaining impurities are diffused into an external layer from the Ru thin layer during a thermal treatment process for making the dense Ru thin layer or the following processes so that characteristics of the Ru thin layer and peripheral layers are aggravated.

To solve the above problem, in case of using hydrogen, which is a reducing gas, as a reaction gas, because a deposition temperature has to be set at over 600° C. in order to activate the hydrogen, the Ru precursor previously undergoes decomposition and then a carbonate or an oxide are produced so that impurities still remain in the Ru layer. When the Ru thin layer is used as an electrode of a capacitor using dielectric layers such as $Ta_2O_5$, BST, PZT, SBT and the like, if the $H_2$ gas is used at a high temperature, $H_2$ reduces the dielectric oxide layer so that the desired electrical characteristics cannot be obtained.

When the Ru thin layer is deposited by the CVD technique using the Ru precursors ($RuX_2$ and $RuX_3$), non-volatile materials, such as carbonate, oxide and the like, are also produced by the gas-phase reaction between a reaction gas and the Ru precursor. These non-volatile materials exist in the Ru thin layer and cause generation of particles.

SUMMARY OF THE DISCLOSURE

A method for fabricating a ruthenium thin layer by using an atomic layer deposition technique is disclosed.

In accordance with one embodiment, a method for fabricating a Ru thin layer comprises: loading a substrate into a reaction chamber for an atomic layer deposition; adsorbing $RuX_n$ (wherein n is 2 or 3), which is a Ru precursor, onto the substrate; and injecting a reductive reaction gas into the reaction chamber.

BRIEF DESCRIPTION OF THE DRAWINGS

The above and other features of the disclosed methods will become apparent from the following description of preferred embodiments taken in conjunction with the accompanying drawings, wherein.

DETAILED DESCRIPTION OF THE PRESENTLY PREFERRED EMBODIMENTS

Hereinafter, methods for fabricating a ruthenium (Ru) thin layer will be described in detail referring to the accompanying drawings.

A method for fabricating the Ru thin layer according to one embodiment of the disclosure will be described. $RuX_2$ and $RuX_3$ materials, of which oxidation states are of +2 and +3 respectively, are used as a Ru precursor and a hydrazine ($N_2H_4$) is used as a reaction gas. Hydrazine is a compound of nitrogen and hydrogen. Hydrazine smokes in air and is a transparent liquid. Also, hydrazine smells like ammonia and has a melting point, boiling point and specific gravity of 2° C., 113.5° C. and 1.021 g/cm³, respectively.

The reaction of the Ru precursor and the hydrazine is as follows:

$RuX_2 + 2N_2H_4 \rightarrow Ru + 2HX + 2NH_3 + N_2,$

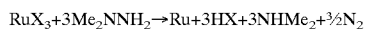
$RuX_3 + 3Me_2NNH_2 \rightarrow Ru + 3HX + 3NHMe_2 + 3/2 N_2$

Where, X is a material selected from the group consisting of H, $C_1 \sim C_{10}$ alkyl, $C_2 \sim C_{10}$ alkenyl, $C_1 \sim C_8$ alkoxy, $C_6 \sim C_{12}$ aryl, β-diketonates, cyclopentadienyl, $C_1$~$C_8$ alkylcyclopentadienyl and derivatives thereof including halogens.

As described in the above equation, a Ru metal layer is produced by the reaction of hydrazine and the precursor ($RuX_2$, $RuX_3$) and some reaction products ($HX$, $NH_3$, $N_2$) having a high volatility are produced. At this time, HX, which is a compound of the hydrogen and ligand, can be easily removed by a vacuum pump.

In an embodiment, when the Ru thin layer is deposited according to the above equation, an atomic layer deposition (ALD) technique, which easily adjusts a reaction on a molecule level basis, is used instead of the CVD. Generally, in the ALD technique, a precursor is chemically adsorbed onto a surface of substrate by providing a precursor. Precursor injection stops and a purge gas is injected into the chamber to remove non-reacted precursor. Subsequently, a reaction gas is injected to react with the precursor adsorbed onto the surface of the substrate so that the desired layer and volatile by-products are produced. After injection of the reaction gas stops, the purge gas is injected again in order to remove the volatile by-products and a non-reacted reaction gas.

As described in the above, the ALD technique uses a surface reaction mechanism so that a stable and uniform thin layer can be acquired. Also, because the gases are separately and sequentially injected and purged, particle production, which is produced by a gas phase reaction, can be suppressed.

Figure 1A:
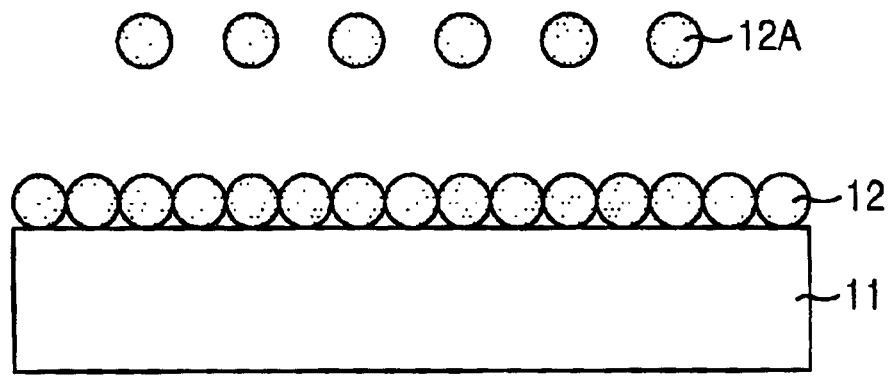
FIGS. 1A to 1C are cross-sectional views illustrating an atomic layer deposition technique of a ruthenium thin layer according to one embodiment of the disclosed methods.
Figure 1B:
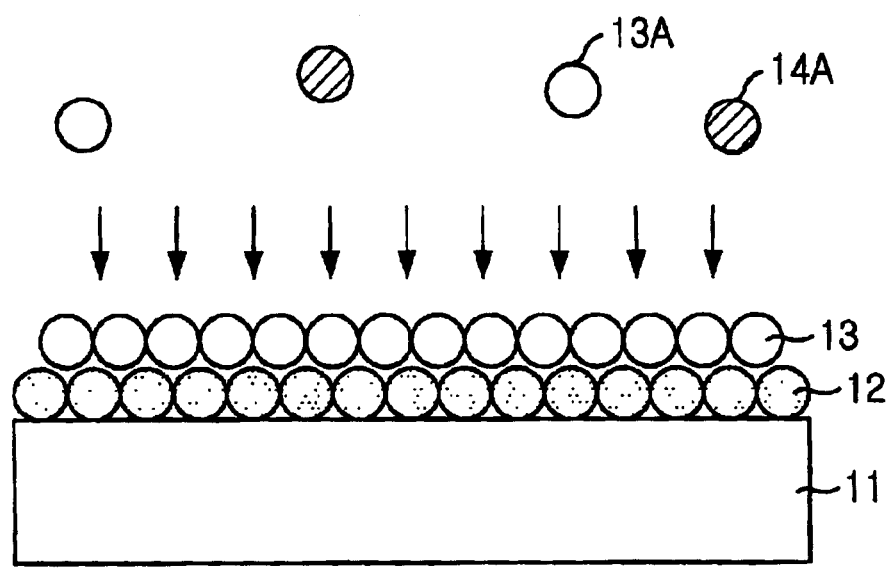

FIGS. 1A and 1B are cross-sectional views showing an atomic layer deposition of the Ru thin layer according to one embodiment.

As shown in FIG. 1A, a substrate 11, which the Ru thin layer will be deposited, is loaded into a reaction chamber (not shown) and the substrate 11 is preheated at a temperature ranging from about 100° C. to about 900° C. The Ru precursor ($RuX_2$ or $RuX_3$) 12 is injected onto the preheated substrate 11 for a time period ranging from about 0.1 seconds to about 5 seconds so that the Ru precursor 12 is adsorbed on a surface of the preheated substrate 11. Sequentially, the $RuX_2$ or $RuX_3$ gas injection is stopped and a purge gas, such as nitrogen ($N_2$) or the like, is injected into the chamber for a time period ranging from about 0.1 seconds to about 5 seconds. Non-adsorbed Ru precursor 12A, except the adsorbed Ru precursor on the surface of the substrate 11, is removed together with the purge gas by a vacuum pump.

As shown in FIG. 1B, hydrazine ($N_2H_4$) 13, which is a reaction gas, is injected for 0.1 seconds to 5 seconds and the reaction gas is reacted with the Ru precursor 12 adsorbed on the surface of the substrate 11 so that the Ru and volatile by-products, such as HX, $NH_3$ and $N_2$, are produced as shown in equation (1). After the hydrazine injection is stopped, the purge gas is injected again in order to remove the volatile by-products 14A and a non-reacted hydrazine 13A and a highly pure Ru thin layer is finally deposited.

Figure 1C:
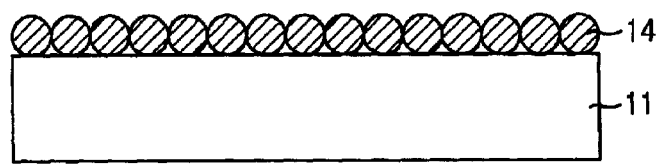

FIG. 1C is a cross-sectional view showing the Ru thin layer produced by the reaction of the hydrazine 13 and the Ru precursor 12.

Figure 2:
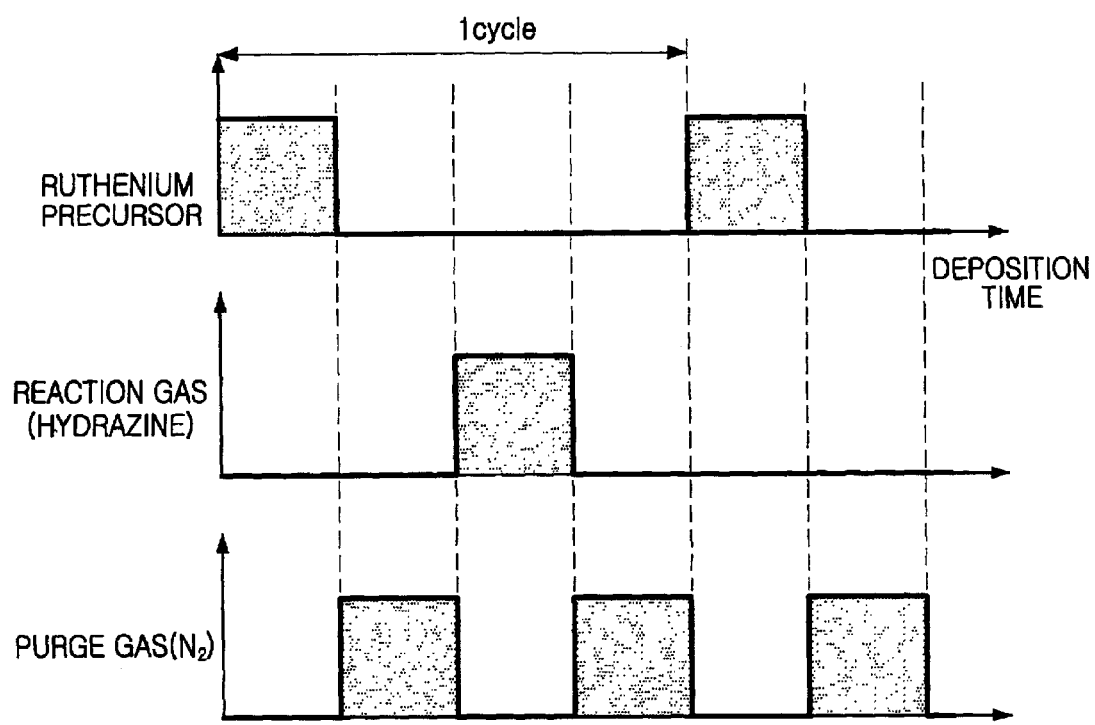
FIG. 2 is a diagram illustrating a sequential injection cycle of a Ru precursor, the reaction gas and the purge gas according to the disclosed methods.

FIG. 2 is a diagram illustrating an injection cycle of the Ru precursor, the reaction gas and the purge gas according to the deposition time. One cycle represents sequential injections of the Ru precursor, the purge gas, the reaction gas and the purge gas. As the cycles are sequentially performed, the Ru thin layer can be deposited at a desired thickness.

Another embodiment will be described. When $RuX_2$ or $RuX_3$, which an oxidation state of Ru is of +2 or +3, are used as a Ru precursor and dimethylhydrazine ($Me_2NNH_2$) is used as a reaction gas, a reaction of the Ru precursor and the dimethylhydrazine is as follows:

$$RuX_2 + 2Me_2NNH_2 \rightarrow Ru + 2HX + 2NHMe_2 + N_2,$$

$$RuX_3 + 3Me_2NNH_2 \rightarrow Ru + 3HX + 3NHMe_2 + \tfrac{3}{2}N_2$$

Where, X is a material selected from a group consisting of H, $C_1$~$C_{10}$ alkyl, $C_2$~$C_{10}$ alkenyl, $C_1$~$C_8$ alkoxy, $C_6$~$C_{12}$ aryl, β-diketonates, cyclopentadienyl, $C_1$~$C_8$ alkylcyclopentadienyl and derivatives thereof including halogens.

A Ru metal layer is produced by a reaction of the dimethylhydrazine and the precursor ($RuX_2$, $RuX_3$) and some reaction products, such as HX, $NHMe_2$ and $N_2$, having a high volatility are produced. At this time, HX, which is a compound of the hydrogen and ligand, can be easily removed by a vacuum pump.

Now, an atomic layer deposition (ALD) technique is described by using the above equation. A substrate, which the Ru thin layer will be deposited, is loaded into a reaction chamber and the substrate is preheated at a temperature ranging from about 100° C. to about 900° C. The Ru precursor ($RuX_2$ or $RuX_3$) gas is injected on the preheated substrate for a time period ranging from about 0.1 seconds to about 5 seconds so that the Ru precursor is adsorbed in a surface of the preheated substrate. Sequentially, the $RuX_2$ or $RuX_3$ gas injection is stopped and a purge gas, such as nitrogen ($N_2$) or the like, is injected into the chamber for a time period ranging from about 0.1 seconds to about 5 seconds. Non-reacted Ru precursor, except the adsorbed Ru precursor on the surface of the substrate, is removed together with the purge gas by a vacuum pump.

Subsequently, dimethylhydrazine ($Me_2NNH_2$), which is a reaction gas, is injected for a time period ranging from about 0.1 seconds to about 5 seconds and the reaction gas is reacted with the Ru precursor adsorbed on the surface of the substrate so that the Ru and volatile by-products, such as HX, $NHMe_2$ and $N_2$, are produced as shown in the above equation. After the dimethylhydrazine injection is stopped, the purge gas is injected again in order to remove the volatile by-products and a non-reacted dimethylhydrazine.

A cycle, representing sequential injections of the Ru precursor, the purge gas, the reaction gas and the purge gas, is sequentially performed so that the Ru thin layer can be deposited at a desired thickness.

Also, $NH_2R$, $NHR_2$, $NR_3$, $C_1$~$C_{10}$ alkylhydrazine, $C_1$~$C_{10}$ dialkylhydrazine or a mixture gas thereof, instead of hydrazine and dimethylhydrazine according to the embodiments of the present invention, can be used as the reaction gas and "R" is used with a material selected from the group consisting of hydrogen, $C_1$~$C_{10}$ alkyl, $C_2$~$C_{10}$ alkenyl, $C_1$~$C_8$ alkoxy, $C_6$~$C_{12}$ aryl and derivatives including elements of halogen group therein.

In similar to the CVD method, hydrogen and oxygen can be used as a reaction gas. $H_2$ has to be decomposed at 600° C. or higher into 2H in order to deposit an atomic layer. Oxygen causes the chemical vapor deposition when the Ru atomic deposition is performed and incorporation of impurities such as carbon, oxygen or the like increases.

Meanwhile, when the hydrazine or the dimethylhydrazine are used in CVD process of the Ru, there are problems, which a deposition temperature is increased compared with the ALD process and step coverage may be poor. But, it is possible to deposit a Ru layer having good physical properties by the CVD technique.

A preferable purge gas according to the embodiments of the present invention may be used with a gas selected from the group consisting of He, Ar, $NH_3$, $H_2$ and a mixture gas thereof instead of nitrogen gas.

Also, one cycle, representing sequential injections of the reductive reaction gas, the purge gas, the Ru precursor, the purge gas, the reductive reaction gas and the purge gas, is applied in a preferable atomic layer deposition (ALD) technique. At this time, injection time of each gas ranges from about 0.1 seconds to about 5 seconds.

As the ALD technique and a strong reductive reaction gas are used in fabricating the Ru thin layer according to the present invention, impurities in the Ru thin layer can be minimized and generation of particles is aggravated. Namely, since the volatile reaction products, such as HX, $NH_3$, $N_2$ and the like, are neutral materials having a high evaporation pressure, the volatile by-products do not remain in the Ru thin layer and can be easily removed in the reaction chamber by a vacuum pump so that carbon, hydrogen and oxygen scarcely remain in the Ru thin layer.

Also, in the general CVD technique, the reaction gas and the precursor, which are a gas state, are partially reacted so that volatile materials are produced, however, the reaction of the reaction gas and the precursor is performed only on the surface of the substrate according to the present invention so that particles are not produced. Also, if the atomic layer deposition technique is employed, because the highly reductive reaction gas is used, it is protected to reduce an oxide layer, which is formed on the substrate, before the Ru thin layer is formed.

In another embodiment, general CVD technique is employed and $RuX_2$ or $RuX_3$ is used as a Ru precursor. Also, a highly reductive gas is used as a reaction gas.

Where, X is a material selected from the group consisting of H, $C_1$~$C_{10}$ alkyl, $C_2$~$C_{10}$ alkenyl, $C_1$~$C_8$ alkoxy, $C_6$~$C_{12}$ aryl, β-diketonates, cyclopentadienyl, $C_1$~$C_8$ alkylcyclopentadienyl and derivatives including elements of halogen group therein.

Hydrazine, ammonia ($NH_3$), $NH_2R$, $NHR_2$, $NR_3$, $C_1$~$C_{10}$ alkylhydrazine, $C_1$~$C_{10}$ dialkylhydrazine, or a mixture gas thereof is used as a reaction gas and "R" is a material selected from the group consisting of hydrogen, $C_1$~$C_{10}$ alkyl, $C_2$~$C_8$ alkenyl, $C_1$~$C_8$ alkoxy, $C_6$~$C_{12}$ aryl and a derivatives including elements of halogen group therein. When the chemical vapor deposition process using the mentioned highly reductive gas is employed, the Ru is deposited at a temperature ranging from abut 100° C. to about 900° C.

As described in the above, impurities in the Ru thin layer are minimized and a highly pure Ru thin layer can be fabricated according to the present invention. Also, as the atomic layer deposition technique is employed, the deposition is performed at low temperature and particle generation can be suppressed.

While the present invention has been described with respect to the particular embodiments, it will be apparent to those skilled in the art that various changes and modifications may be made without departing from the spirit and scope of the invention as defined in the following claim.

What is claimed:

1. A method for fabricating a ruthenium (Ru) thin layer comprising:

loading a substrate into a reaction chamber for an atomic layer deposition;

injecting $RuX_n$ into the reaction chamber, wherein n is 2 or 3, and adsorbing the $RuX_n$ onto a surface of the substrate wherein X is a material selected from the group consisting of hydrogen (H), $C_1$~$C_{10}$ alkyl, $C_2$~$C_{10}$ alkenyl, $C_1$ $C_8$ alkoxy, $C_6$~$C_{12}$ aryl, diketonates, cyclopentadienyl, $C_1$ $C_8$ alkylcyclopentadienyl and derivatives thereof including one or more halogen groups; and injecting a reaction gas reductive to the $RuX_n$ into the reaction chamber.

2. The method as recited in claim 1, wherein the method further comprises injecting a the reaction gas and a purge gas before the $RuX_n$ is adsorbed onto the surface of the substrate.

3. The method as recited in claim 1, wherein the reductive reaction gas is a gas selected from the group consisting of hydrazine ($N_2H_4$), ammonia ($NH_3$), $NH_2R$, $NHR_2$, $NR_3$, $C_1$~$C_{10}$ alkylhydrazine, $C_1$~$C_{10}$ dialkylhydrazine and a mixture gas thereof and R is a material selected from the group consisting of hydrogen, $C_1$~$C_{10}$ alkyl, $C_2$~$C_8$ alkenyl, $C_1$~$C_8$ alkoxy, $C_6$~$C_{12}$ aryl and derivatives thereof including one or more halogen groups.

4. The method as recited in claim 1, wherein the method further comprises removing non-reacted $RuX_n$ by injecting a purge gas after injecting the $RuX_n$.

5. The method as recited in claim 4, wherein the purge gas is a gas selected from the group consisting of nitrogen, helium, argon, ammonia, hydrogen and mixtures thereof.

6. The method as recited in claim 1, wherein the method further comprises removing volatile by-products and non-reacted reaction gases by injecting the purge gas after injecting the reductive reaction gas.

7. The method as recited in claim 6, wherein the $RuX_n$, the reductive reaction gas and the purge gas are injected for a time period ranging from about 0.1 seconds to about 5 seconds.

8. The method as recited in claim 1, wherein the substrate is preheated at a temperature ranging from about 100° C. to about 900° C. before the $RuX_n$ is injected into the reaction chamber.

9. A method for fabricating a ruthenium (Ru) thin layer comprising:

loading a substrate into a reaction chamber for an atomic layer deposition;

injecting $RuX_n$ into the reaction chamber wherein n is 2 or 3 and adsorbing the $RuX_n$ onto a surface of the substrate wherein X is a material selected from the group consisting of hydrogen (H), $C_1$~$C_{10}$ alkyl, $C_2$~$C_{10}$ alkenyl, $C_1$ $C_8$ alkoxy, $C_6$~$C_{12}$ aryl, diketonates, cyclopentadienyl, $C_1$ $C_8$ alkylcyclopentadienyl and derivatives thereof including one or more halogen groups; and injecting a reaction gas reductive to the $RuX_n$ into the reaction chamber, wherein the reductive reaction gas is a gas selected from the group consisting of hydrazine ($N_2H_4$), ammonia ($NH_3$), $NH_2R$, $NHR_2$, $NR_3$, $C_1$~$C_{10}$ alkylhydrazine, $C_1$~$C_{10}$ dialkylhydrazine and mixtures thereof and R is a material selected from the group consisting of hydrogen, $C_1$~$C_{10}$ alkyl, $C_2$~$C_8$ alkenyl, $C_1$~$C_8$ alkoxy, $C_6$~$C_{12}$ aryl and derivatives thereof including one or more halogen groups before the $RuX_n$ is adsorbed onto the surface of the substrate.

* * * * *

UNITED STATES PATENT AND TRADEMARK OFFICE
CERTIFICATE OF CORRECTION

PATENT NO. : 6,800,542 B2
DATED : October 5, 2004
INVENTOR(S) : Youn-Soo Kim

It is certified that error appears in the above-identified patent and that said Letters Patent is hereby corrected as shown below:

Title page,
Item [75], Inventors, please delete "Younsoo" and insert -- Youn-Soo -- in its place.
Item [73], Assignee, please delete "Kyoungki-di" and insert -- Kyoungki-do -- in its place.

Column 6,
Line 3, after "$C_2 \sim C_{10}$ alkenyl," please delete "C1 C8" and insert -- $C_1 \sim C_8$ -- in its place.
Line 4, after "cyclopentadienyl," please delete "$C_1\ C_8$" and insert -- $C_1 \sim C_8$ -- in its place.
Line 10, after "injecting" please delete "a the reaction" and insert -- the reaction -- in its place.
Line 48, after "alkenyl," please delete "$C_1\ C_8$" and insert -- $C_1 \sim C_8$ -- in its place.
Line 49, after "cyclopentadienyl," please delete "$C_1\ C_8$" and insert -- $C_1 \sim C_8$ -- in its place.
Lines 60-61, after "groups before" please delete "groups before" and insert -- "groups injecting the reaction gas and a purge gas before -- in its place.

Signed and Sealed this

Twelfth Day of April, 2005

JON W. DUDAS
*Director of the United States Patent and Trademark Office*